(12) United States Patent
Hong

(10) Patent No.: US 6,645,779 B2
(45) Date of Patent: Nov. 11, 2003

(54) FERAM (FERROELECTRIC RANDOM ACCESS MEMORY) AND METHOD FOR FORMING THE SAME

(75) Inventor: Suk-Kyoung Hong, Ichon-shi (KR)

(73) Assignee: Hynix Semiconductor Inc., Ichon (KR)

( * ) Notice: Subject to any disclaimer, the term of this patent is extended or adjusted under 35 U.S.C. 154(b) by 88 days.

(21) Appl. No.: 09/948,690

(22) Filed: Sep. 10, 2001

(65) Prior Publication Data

US 2002/0142488 A1 Oct. 3, 2002

(30) Foreign Application Priority Data

Mar. 28, 2001 (KR) ........................ 2001-16153

(51) Int. Cl.⁷ .............................. H01L 21/00
(52) U.S. Cl. ................... 438/3; 438/240; 438/393; 438/396; 257/295; 257/310; 257/306; 257/308; 257/532; 361/303
(58) Field of Search ............ 438/3, 396, 240, 438/393; 257/310, 295, 532, 306, 308; 361/303

(56) References Cited

U.S. PATENT DOCUMENTS

| | | | |
|---|---|---|---|
| 4,182,636 A | * 1/1980 | Dennard et al. | ............ 438/250 |
| 5,335,138 A | 8/1994 | Sandhu et al. | |
| 5,504,041 A | 4/1996 | Summerfelt | |
| 5,851,896 A | 12/1998 | Summerfelt | |
| 6,043,529 A | * 3/2000 | Hartner et al. | ............. 257/306 |
| 6,146,963 A | * 11/2000 | Yu | ............................ 438/396 |

FOREIGN PATENT DOCUMENTS

| | | | |
|---|---|---|---|
| JP | 05-009021 | 1/1993 | ............ C01G/1/02 |
| JP | 05-017139 | 1/1993 | ............ C01G/1/02 |
| JP | 05-139730 | 6/1993 | ............ C01G/1/00 |
| JP | 07-153644 | 6/1995 | ............ H01G/4/10 |
| JP | 2001-60670 | 6/2001 | ............ H01L/27/10 |

* cited by examiner

Primary Examiner—Matthew Smith
Assistant Examiner—Belur V. Keshavan
(74) Attorney, Agent, or Firm—Jacobson Holman PLLC

(57) ABSTRACT

A ferroelectric random access memory (FeRAM) device including a semiconductor substrate, a transistor, a first interlayer insulating film formed on the transistor, a plug buried in a contact hole exposing the source/drain region of the transistor, a metal diffusion barrier film formed by depositing a Ti and/or TiN on the contact hole, an Ir oxidation barrier film formed on the plug and the first interlayer insulating film, a lateral oxidation barrier film formed on sidewalls of the first oxidation barrier film and on a portion of the first interlayer insulating film in order to prevent oxygen from diffusing into an interface therebetween, a bottom electrode formed on the first oxidation barrier film and the lateral oxidation barrier film, a ferroelectric film formed on the bottom electrode, and a top electrode formed on the ferroelectric film.

12 Claims, 8 Drawing Sheets

FERAM (FERROELECTRIC RANDOM ACCESS MEMORY) AND METHOD FOR FORMING THE SAME

FIELD OF THE INVENTION

The present invention relates to a ferroelectric random access memory (FeRAM) and, more particularly, to a method for forming the FeRAM using an aluminum oxide layer as an oxygen diffusion barrier.

DESCRIPTION OF THE PRIOR ART

A ferroelectric random access memory (FeRAM) is a nonvolatile semiconductor memory device with a highly integrated dynamic random access memory (DRAM), the speedy information processing of a static random access memory (SRAM), and the information storing function of a flash memory. As compared with a conventional flash memory and an electrically erasable programmable read only memory (EEPROM), it has a relatively low operational voltage and an operational speed that is about 1000 times faster.

When voltage is applied to a DRAM capacitor, which includes a dielectric layer such as a $SiO_2$ layer or a SiON layer, and then the voltage supply is terminated, the charges in the DRAM capacitor are discharged so that data stored in the DRAM are lost.

Being different from the DRAM capacitor, a ferroelectric capacitor in the FeRAM maintains previously stored data by the remnant polarization of a ferroelectric material even if the power supply is terminated.

FIG. 1 is a circuit diagram illustrating a memory cell structure of a conventional FeRAM device including one transistor and one ferroelectric capacitor. A pass-gate transistor (Tr) is connected to a bit line (BL) and a capacitor (C), and the capacitor (C) functions as a charge storage element through a first electrode and a second electrode which are respectively connected to a plate line (PL) and the transistor (Tr). Also, a ferroelectric layer is formed between the first electrode and the second electrode.

The FeRAM device is similar to the DRAM device in that a capacitor and a transistor are connected to a word line and a plate line, respectively. However, the FeRAM device is different from the DRAM device in that the capacitor has a thin ferroelectric layer and the plate line is not connected to ground voltage or a fixed voltage, e.g., ½ Vcc, and each cell is connected to a separate plate line so that power can be applied to the separate plate line on a cell-by-cell basis.

FIG. 2 is a graph showing a hysteresis loop of a ferroelectric capacitor. In FIG. 2, positive voltage is defined when the potential of the plate line is higher than that of the bit line and remnant polarization at points "a" and "c", are defined to data "1" and "0", respectively.

If the transistor is turned on and a negative voltage level is applied to the plate line "PL", then a negative voltage is also applied to the ferroelectric capacitor and a charge variation passes through point "d" in the hysteresis loop. After that, in case of turning the applied voltage to "0 V", polarization value goes to point "a" and the data "1" is stored. Meanwhile, a positive voltage level is applied to the ferroelectric capacitor, the charge variation passes through point "b", a polarization value goes to point "c" by turning the applied voltage to "0 V" and the data "0" is stored.

When the voltage is applied to the ferroelectric capacitor, data reading process is carried out by detecting a voltage variation on the bit line. That is, if a positive voltage is applied to the capacitor, in case the data is "0", the charge variation of $\Delta Q_0$ is detected. That is, the charge variation on the bit line is determined by information stored on the capacitor.

The charge variation due to the remnant polarization of the ferroelectric capacitor changes a voltage level on the bit line. Typically, parasite capacitance "Cb" exists on the bit line itself. When the transistor is turned on and a memory to be read out is selected, charges of as much as $\Delta Q_1$ or $\Delta Q_0$ are outputted. Bit line voltages "V1" and "V0" are acquired by dividing the $\Delta Q_1$ and the $\Delta Q_0$ with the sum of bit line capacitance (Cb) and ferroelectric capacitor (C) capacitance "Cs", respectively and these values are given by:

$$V1 = \Delta Q_1/(Cb+Cs)$$

$$V0 = \Delta Q_0/(Cb+Cs)$$

Therefore, the potential on the bit line is varied according to the difference between the data "1" and "0". When the transistor is turned on by applying a voltage level to the word line, the potential on the bit line is changed to the "V1" or the "V0". In order to determine whether potential on the bit line is in a voltage level of "V1" or "V0", a reference voltage (Vref), which is set to a specific voltage level between the voltage levels "V1" and "V0", is used.

$SrBi_2Ta_2O_9$ (hereinafter, referred to as an SBT), $(Bi, La)_4Ti_3O_{12}$ (hereinafter, referred to as a BLT) or $Pb(Zr, Ti)O_3$ (hereinafter, referred to as a PZT) thin layer is mainly used as a dielectric material in the FeRAM. Since a ferroelectric material is of crystallized structure, a bottom material disposed thereunder is important in growing the ferroelectric material. That is, in the ferroelectric capacitor, the electrode is largely affected by the ferroelectric characteristics, so there is a requirement for sufficiently low resistance, a small lattice mismatch between the ferroelectric material and the electrode, a high heat-resistance, a low reactivity, a high oxidation barrier characteristic and a good adhesion between the electrode and the ferroelectric material.

Especially, the ferroelectric memory device manufacturing process incorporates a high thermal process. Accordingly, a polysilicon layer, which has been used in a DRAM device, cannot be used as an electrode, because the polysilicon layer may be oxidized in forming a ferroelectric layer, such as the SBT, or in other thermal processes.

Therefore, in a conventional method, a metal layer is used as an interconnection layer in the FeRAM device, connecting a top electrode of the ferroelectric capacitor to a metal oxide semiconductor field effect transistor (MOSFET).

FIG. 3 is a cross sectional view showing a FeRAM device according to the prior art. A transistor having a gate insulating film 12, a gate electrode 13 and a source/drain region 14 is formed in a semiconductor substrate 10 where a field oxide layer 11 is formed. A first interlayer insulating film 15 is formed over the transistor and a tungsten or a polysilicon plug 16 is buried in a contact hole exposing the source/drain region 14 of the transistor through a selective etching process of the first interlayer insulating film 15. Also, an Ir oxidation barrier film 17 is formed on the plug 16 and a $Si_3N_4$ film spacer 18 is formed on the sidewalls of the Ir oxidation barrier film 17. A bottom electrode 19 of a ferroelectric capacitor is formed on the Ir oxidation barrier film 17 and the $Si_3N_4$ film spacer 18, and a ferroelectric film 20, a top electrode 21, and a second interlayer insulating film 22 are, in this order, formed on the entire structure. To form the ferroelectric film 20 for charge storage, a thermal treatment process is carried out at a high temperature of approximately 650° C. to 750° C. in an oxygen atmosphere. During this process, oxygen may penetrate into the ferroelectric film 20, the bottom electrode 19 and the Ir oxidation barrier film 17. If the plug 16, which forms an electrically connecting path between the capacitor and the transistor, is oxidized by the penetrating oxygen, the oxidized plug may cause an electrical disconnection between the capacitor and the transistor.

FIG. 4 is a cross sectional view showing oxygen oxidation paths ("a", "b") in the prior art ferroelectric capacitor of FIG. 3. Although, in the prior stacked capacitor, the oxidation of the plug 16 in the vertical direction "a" is prevented by using the Ir oxidation barrier film 17, the oxygen can easily penetrate into the plug 16 in the horizontal direction indicated by "b" through an interface between the Ir oxidation barrier film 17 and the first interlayer insulating film 15. Further the penetrating oxygen oxidizes a contacted part between the plug 16 and the Ir oxidation barrier 17.

Accordingly, a thermal treatment condition in order to crystallize the ferroelectric film is limited by the potential for oxidation of the plug. Typically, a furnace annealing is performed at a low temperature of about 650° C. or a rapid thermal annealing is performed at a temperature of about 700° C. in order to crystallize the ferroelectric film. However, because these thermal treatments cannot sufficiently crystallize the ferroelectric film, there is a problem in which the characteristics of the ferroelectric capacitor may deteriorate in the following processes.

SUMMARY OF THE INVENTION

It is, therefore, an object of the present invention to provide a ferroelectric random access memory (FeRAM) device using an aluminum oxide layer as an oxygen oxidation barrier and a method for forming the same.

In accordance with an aspect of the present invention, there is provided a FeRAM device comprising a semiconductor substrate; a transistor having a gate insulating film, a gate electrode and a source/drain region that are formed in the semiconductor substrate; a first interlayer insulating film formed over the transistor; a plug buried in a contact hole exposing the source/drain region of the transistor through a selective etching process of the first interlayer insulating film; a first oxidation barrier film formed on the plug and the first interlayer insulating film; a lateral oxidation barrier film formed on sidewalls of the first oxidation barrier film and on a portion of the first interlayer insulating film in order to prevent oxygen from diffusing into the interface therebetween; a bottom electrode formed on the first oxidation barrier film and the lateral oxidation barrier film; a ferroelectric film formed on the bottom electrode; a top electrode formed on the ferroelectric film; and a second interlayer insulating film formed on the entire structure.

In accordance with another aspect of the present invention, there is provided a ferroelectric random access memory (FeRAM) device comprising a semiconductor substrate; a transistor having a gate insulating film, a gate electrode and a source/drain region that are formed in the semiconductor substrate; a first interlayer insulating film formed over the transistor; a plug buried in a contact hole exposing the source/drain region of the transistor through a selective etching process of the first interlayer insulating film; an oxidation barrier film formed on the plug and the first interlayer insulating film; an aluminum oxide ($Al_2O_3$) oxidation barrier film formed on sidewalls of the oxidation barrier film and the first interlayer insulating film; a silicon nitride ($Si_3N_4$) oxidation barrier film formed on the aluminum oxide ($Al_2O_3$) oxidation barrier film; a bottom electrode formed on the aluminum oxide ($Al_2O_3$) oxidation barrier film and the silicon nitride ($Si_3N_4$) oxidation barrier film; a ferroelectric film formed on the bottom electrode; a top electrode formed on the ferroelectric film; and a second interlayer insulating film formed on the entire structure.

In accordance with still another aspect of the present invention, there is provided a method for fabricating a ferroelectric random access memory (FeRAM), comprising the steps of: a) forming a semiconductor substrate; b) forming a transistor having a gate insulating film, a gate electrode and a source/drain region that are formed in the semiconductor substrate; c) forming a first interlayer insulating film over the transistor; d) burying a plug in a contact hole exposing the source/drain region of the transistor through a selective etching process of the first interlayer insulating film; e) forming a first oxidation barrier film on the plug and the first interlayer insulating film; f) forming a lateral oxidation barrier film on sidewalls of the first oxidation barrier film and a portion of the first interlayer insulating film in order to prevent oxygen from diffusing into the interface therebetween; g) forming a bottom electrode on the first oxidation barrier film and lateral oxidation barrier film; h) forming a ferroelectric film on the bottom electrode; i) forming a top electrode on the ferroelectric thin film; and j) forming a second interlayer insulating film on the entire structure.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Hereinafter, a ferroelectric random access memory (FeRAM) according to the present invention will be described in detail referring to the accompanying drawings, where like numerals refer to like elements throughout.

Figure 1:
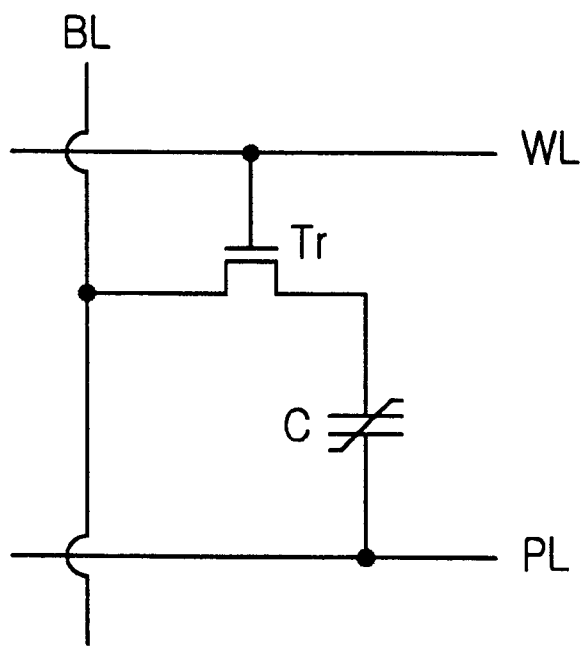
FIG. 1 is a circuit diagram of a conventional FeRAM cell having one transistor and one ferroelectric capacitor.
Figure 2:
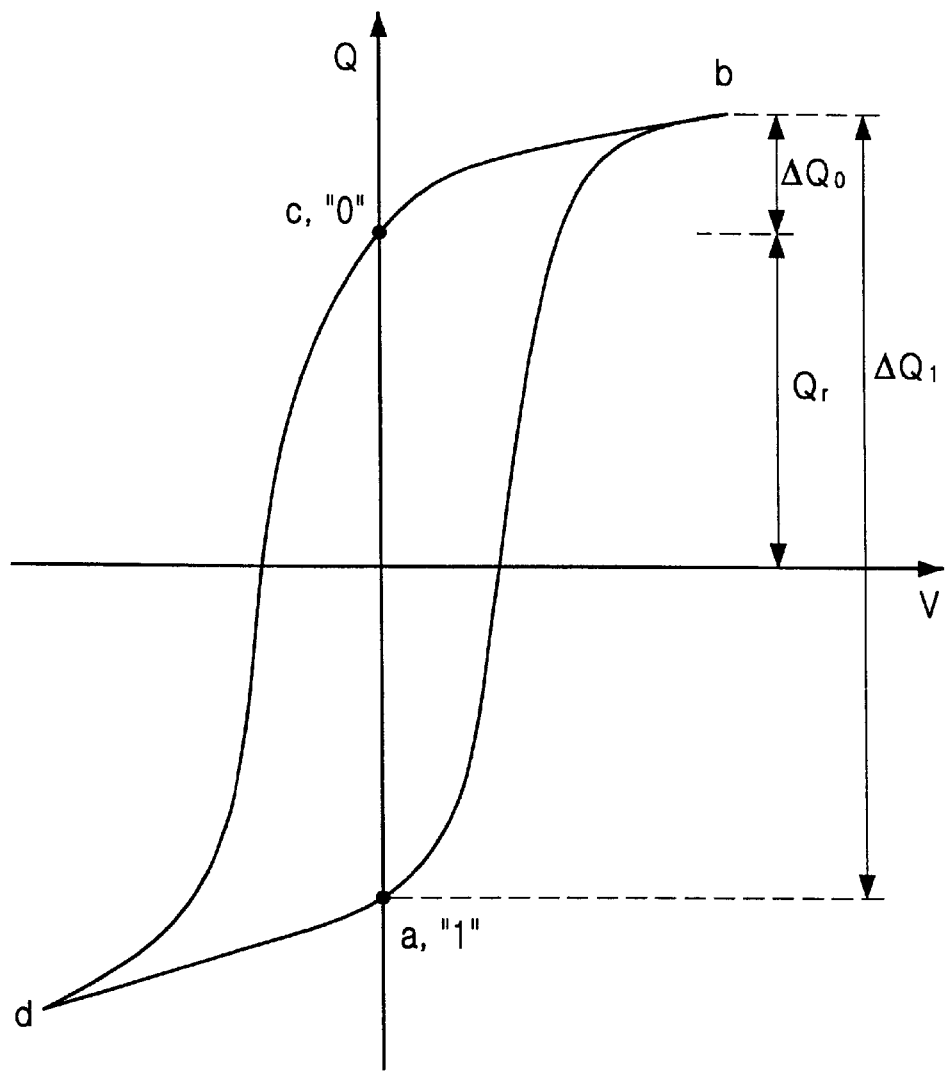
FIG. 2 is a hysteresis loop showing a hysteresis characteristic of a ferroelectric material.
Figure 3:
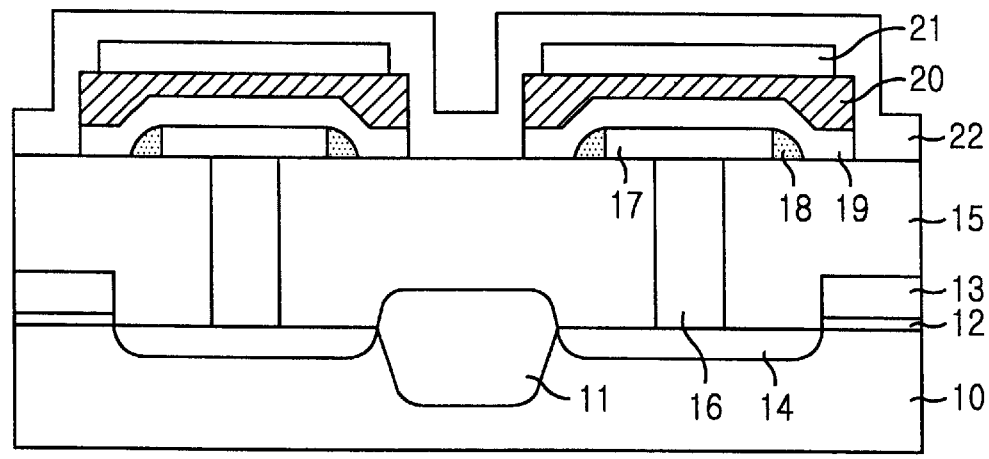
FIG. 3 is a cross sectional view showing a conventional FeRAM.
Figure 4:
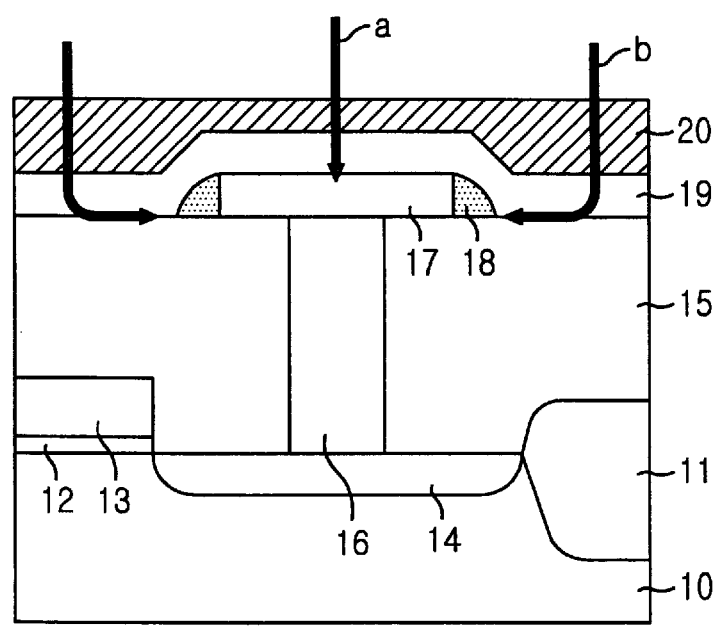
FIG. 4 is a cross sectional view showing oxygen oxidation paths for the conventional ferroelectric stacked capacitor manufacturing process of FIG. 3.
Figure 5:
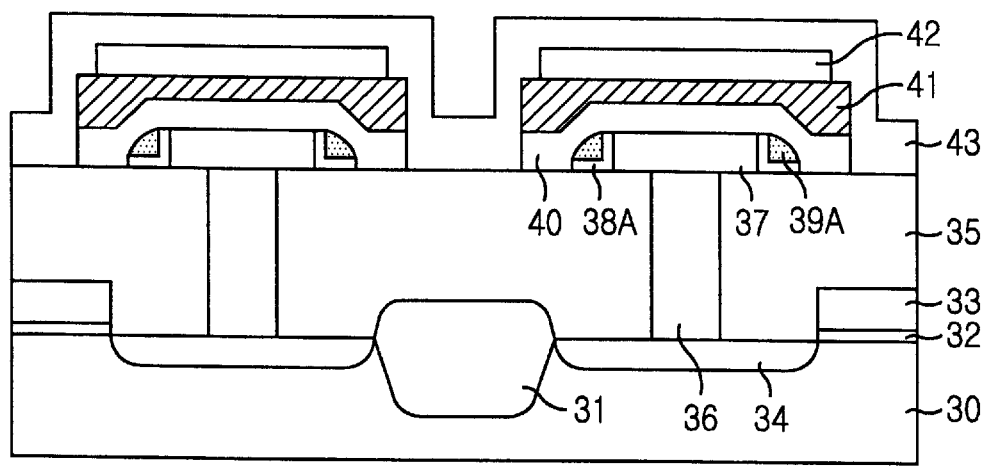
FIG. 5 is a cross sectional view showing a FeRAM according the present invention.

FIG. 5 is a cross sectional view showing a FeRAM according to the present invention. A transistor having an insulating film 32, a gate electrode 33 and a source/drain region 34 is formed on a semiconductor substrate 30 where a field oxide layer 31 is formed. A first interlayer insulating film 35 is formed over the transistor and a tungsten or polysilicon plug 36 is buried in a contact hole exposing the source/drain region 34 of the transistor through a selective etching process of the first interlayer insulating film 35. Also, an Ir oxidation barrier film 37 is formed on the plug 3 and an L-shaped $Al_2O_3$ oxidation barrier spacer 38A is formed on the sidewalls of the Ir oxidation barrier film 37 and the first interlayer insulating film 35. A $SI_3N_4$ oxidation barrier spacer 39A is formed on the L-shaped $Al_2O_3$ oxidation barrier spacer 38A and a bottom electrode 40 is formed on the Ir oxidation barrier film 37, the $Al_2O_3$ oxidation barrier spacer 38A and the $Si_3N_4$ oxidation barrier spacer 39A. A ferroelectric film 41, a top electrode 42 and a second interlayer insulating film 43 are, in this order, formed on the entire structure. At this time, Ru oxidation barrier film can be used instead of the Ir oxidation barrier film 37.

FIGS. 6A to 6H show cross sectional views illustrating a method of manufacturing the FeRAM according to the present invention. First, referring to FIG. 6A, a field oxide layer 31 is formed in the semiconductor substrate 30. A MOS (Metal Oxide Semiconductor) transistor having a gate insulating film 32, a gate electrode 33 and the source/drain region 34 are sequentially formed on the semiconductor substrate 30. Then, a first interlayer insulating film 35 is formed on the MOS transistor and a planarization process is applied to the first interlayer insulating film 35 using the chemical mechanical polishing technique. The first interlayer insulating film 35 is selectively etched so as to open a contact hole exposing the source/drain region 34 to be connected to the capacitor.

Figure 6A:
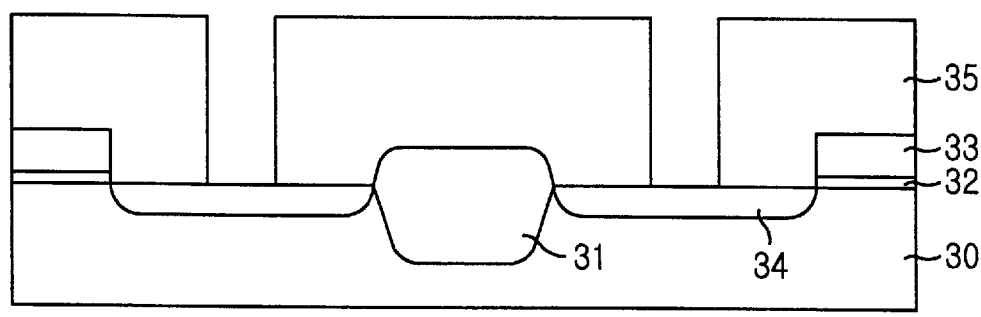
FIGS. 6A to 6H are cross sectional views showing a method of manufacturing a FeRAM according to the present invention.
Figure 6B:
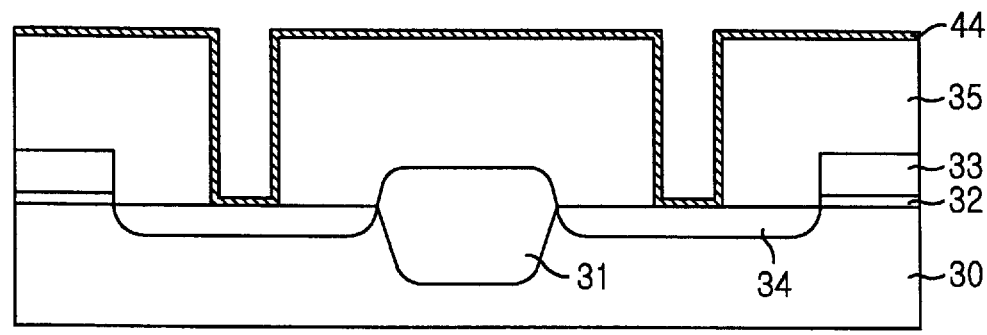

Referring to FIG. 6B, a metal barrier film 44 is formed by depositing a Ti and/or TiN film on the entire structure, being in contact with the source/drain region 34. Formation of the metal barrier can be omitted depending upon plug materials.

Figure 6C:
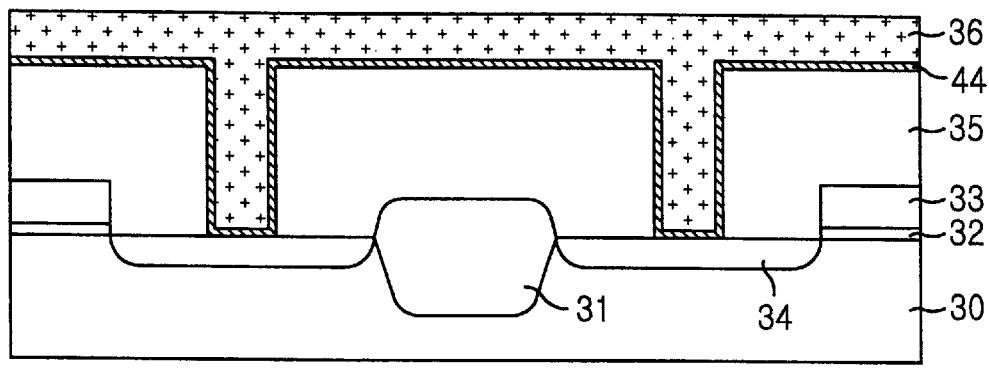
Figure 6D:
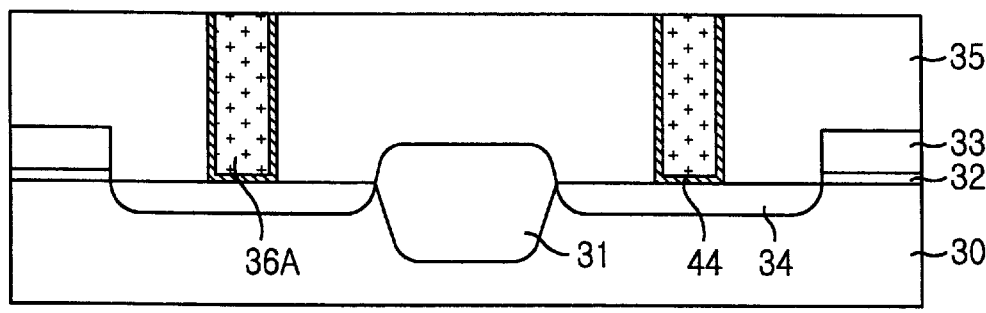

Referring to FIG. 6C, a conductive film 36 for a plug, such as a tungsten, a polysilicon or the like, is buried in the contact hole and on the metal diffusion barrier film 44. The conductive film 36 and the metal barrier film 44 are etched back using reactive ion etching (RIE), until the surface of the first interlayer insulating film 35 is exposed, as shown in FIG. 6D. The metal barrier film 44 remains in the contact hole and the conductive film 36A also remains on the metal barrier film 44 in the contact hole.

Figure 6E:
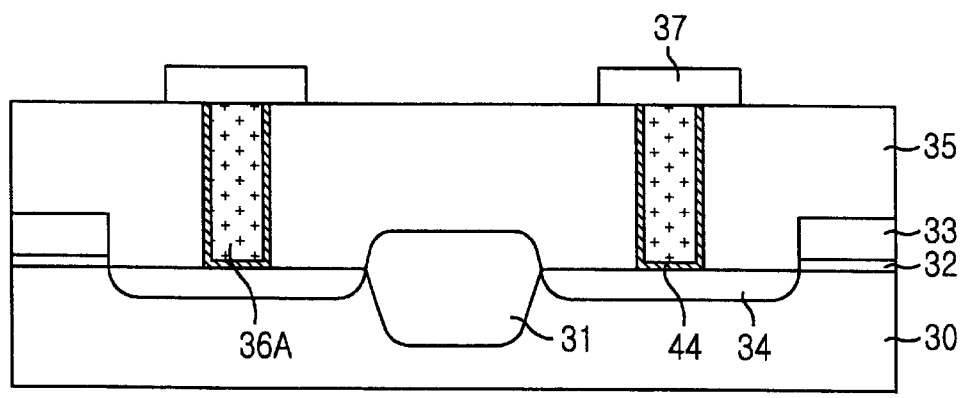

Referring to FIG. 6E, an Ir oxidation barrier pattern 37 is formed on the conductive film 36A to a thickness of approximately 1000 Å to 1500 Å. At this time, the Ru oxidation barrier film can be used instead of the Ir oxidation barrier film 37.

Figure 6F:
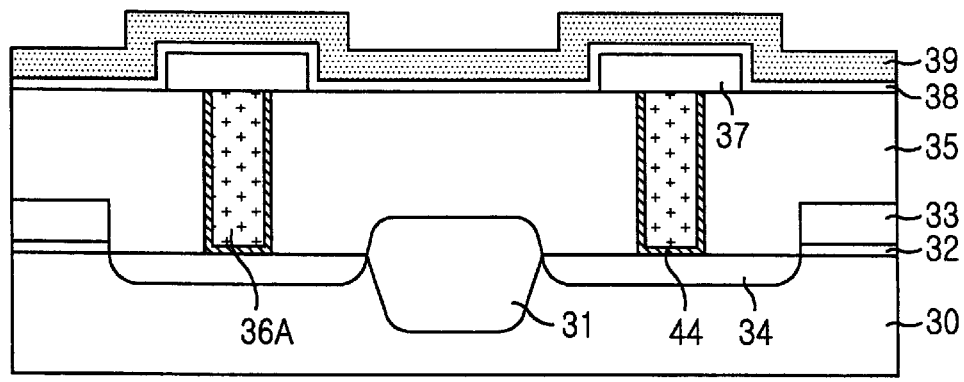

Referring to FIG. 6F, an $Al_2O_3$ film 38 is formed to a thickness of approximately 100 Å to 300 Å and then a $Si_3N_4$ film 39 is formed to a thickness of approximately 2000 Å to 2500 Å on the entire structure for preventing oxygen diffusion.

Figure 6G:
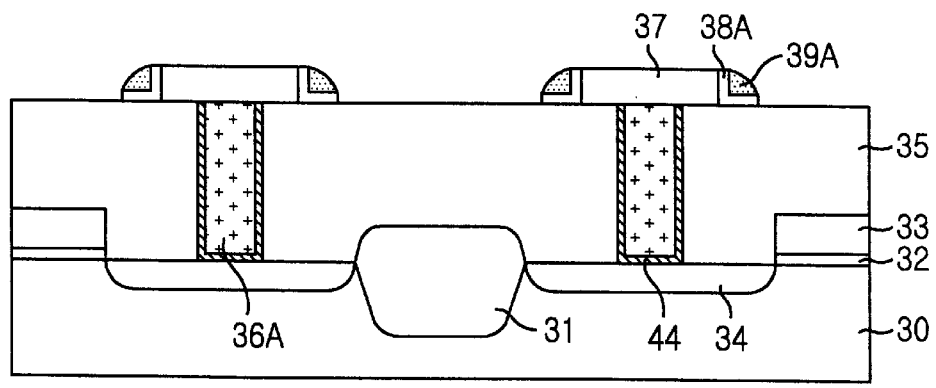

Referring to FIG. 6G, the $Al_2O_3$ oxidation barrier film 38 is etched by the anisotropic etching process and the $Si_3N_4$ oxidation barrier film 39 is etched by the anisotropic etching process.

Accordingly, an $Al_2O_3$ oxidation barrier spacer 38A having a L-shaped film is formed, being in contact with the sidewalls of the Ir oxidation barrier pattern 37 and a portion of the first interlayer insulating film 35. Since the anisotropic dry etching process is also applied to the $Si_3N_4$ oxidation barrier film 39, a $Si_3N_4$ oxidation barrier spacer 39A is formed on the $Al_2O_3$ oxidation barrier spacer 38A. As a result, there are three oxidation barrier films which act to prevent oxygen from diffusing into the conductive film 36A, namely the Ir oxidation barrier film 37, the $Al_2O_3$ oxidation barrier film 38 which forms spacer 38A and the $Si_3N_4$ oxidation barrier film 39 which forms spacer 39A.

The $Al_2O_3$ oxidation barrier spacer 38A is formed by a self-alignment between the sidewalls of the Ir oxidation barrier film 37 and the $Si_3N_4$ oxidation barrier spacer 39A and between the first interlayer insulating film 35 and the $Si_3N_4$ oxidation barrier spacer 39A.

The $Si_3N_4$ oxidation barrier film 39 and the $Al_2O_3$ oxidation barrier film 38 are etched back, to form the spacers 39A, 38A respectively, at a source power of 650 W to 750 W or a bias power of 150 W to 250 W and, as etching gases, an Ar gas of 30 sccm to 50 sccm, a $CF_4$ gas of 5 sccm to 20 sccm or a $Cl_2$ gas of 10 sccm to 20 sccm are injected. At this time a pressure in a chamber is 2 mTorr to 5 mTorr.

Figure 6H:
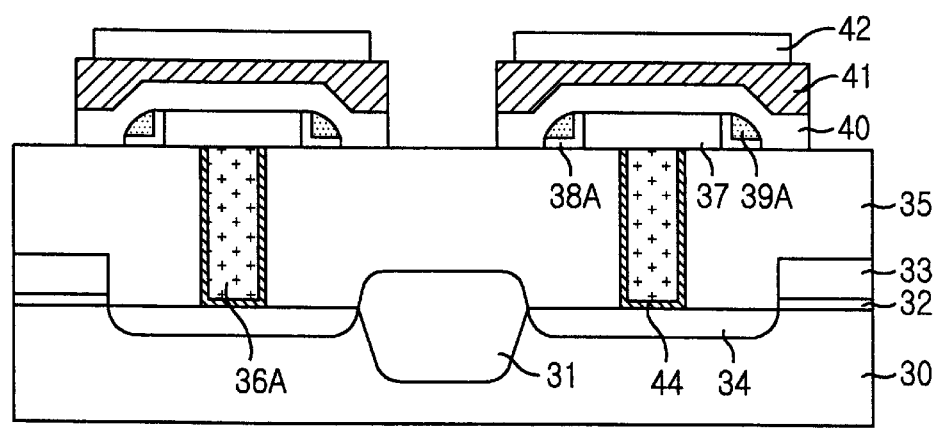

Referring to FIG. 6H, a bottom electrode 40 is formed on the Ir oxidation barrier film 37, the $Al_2O_3$ oxidation barrier spacer 38A and the $Si_3N_4$ oxidation barrier spacer 39A. A ferroelectric film 41, such as $Pb(Zr, Ti)O_3$ (PZT), $(Bi, La)_4Ti_3O_{12}$ (BLT), $SrBi_2Ta_2O_9$ (SBT) or the like, is formed on the bottom electrode 40. By forming a top electrode 42 on the ferroelectric film 41 after crystallizing the ferroelectric film 41 by performing the thermal treatment at a high temperature in an oxygen atmosphere, the formation of the ferroelectric capacitor is completed and, finally, the top electrode 42, the ferroelectric film 41 and the bottom electrode 40 are patterned and the second interlayer insulating film (not shown) is formed on the entire structure.

In the present invention, as the first, second and third oxidation barrier films are formed, the lateral oxidation of oxygen through a boundary between the first oxidation barrier and the first interlayer insulating film is effectively prevented. Accordingly, oxidation of the plug is also prevented.

While the present invention has been described with respect to the particular embodiments, it will be apparent to those skilled in the art that various changes and modifications may be made without departing from the spirit and scope of the invention as defined in the following claim.

What is claimed is:

1. A ferroelectric random access memory (FeRAM) device comprising:
   a semiconductor substrate;
   a transistor having a gate insulating film, a gate electrode and a source/drain region that are formed in the semiconductor substrate;
   a first interlayer insulating film formed over the transistor;
   a plug buried in a contact hole exposing the source/drain region of the transistor through a selective etching process of the first interlayer insulating film;
   a first oxidation barrier film formed on the plug and the first interlayer insulating film;
   a lateral oxidation barrier film formed on sidewalls of the first oxidation barrier film and a portion of the first interlayer insulating film in order to prevent oxygen from diffusion into interface therebetween, wherein the lateral oxidation barrier film includes a second oxidation barrier film formed on sidewalls of the first oxidation barrier film and on a portion of the first interlayer insulating film, and a third oxidation barrier film formed on the second oxidation barrier film;
   a bottom electrode formed on the first oxidation barrier film, the second barrier film and the lateral oxidation barrier film;
   a ferroelectric thin film formed on the bottom electrode; and
   a top electrode formed on the ferroelectric thin film.

2. The FeRAM device as recited in claim 1, further comprising a metal barrier film on inner walls of the contact hole and in contact with the source/drain region.

3. A ferroelectric random access memory (FeRAM) device comprising:

a semiconductor substrate;

a transistor having a gate insulating film, a gate electrode and a source/drain region that are formed in the semiconductor substrate;

a first interlayer insulating film formed over the transistor;

a plug buried in a contact hole exposing the source/drain region of the transistor through a selective etching process of the first interlayer insulating film;

an oxidation barrier film formed on the plug and on the first interlayer insulating film;

an aluminum oxide ($Al_2O_3$) oxidation barrier film formed on sidewalls of the oxidation barrier film and a portion of the first interlayer insulating film in order to prevent oxygen from diffusion into an interface between the aluminum oxide ($Al_2O_3$) oxidation barrier film and the interlayer insulating film;

a silicon nitride ($Si_3N_4$) oxidation barrier film formed on the aluminum oxide ($Al_2O_3$) oxidation barrier film;

a bottom electrode formed on the aluminum oxide ($Al_2O_3$) oxidation barrier film and the silicon nitride ($Si_3N_4$) oxidation barrier film;

a ferroelectric thin film formed on the bottom electrode; and a top electrode formed on the ferroelectric thin film.

4. The FeRAM device as recited in claim 3, wherein the oxidation barrier film is one of an iridium (Ir) film and a ruthenium (Ru) film.

5. The FeRAM device as recited claim 4, wherein the ferroelectric film is selected from the group consisting of $Pb(Zr, Ti)O_3$, $(Bi, La)_4Ti_3O_{12}$ and $SrBi_2Ta_2O_9$.

6. The FeRAM device as recited in claim 4, wherein the aluminum oxide ($Al_2O_3$) film has a thickness of 100 Å to 300 Å.

7. The FeRAM device as recited in claim 3, further comprising a metal barrier film on inner walls of the contact hole and in contact with the source/drain region.

8. A method for fabrication a ferroelectric random access memory (FeRAM), comprising the steps of:

a) forming a semiconductor substrate;

b) forming a transistor having a gate insulating film, a gate electrode and a source/drain region that are formed in the semiconductor substrate;

c) forming a first interlayer insulating film over the transistor;

d) burying a plug in a contact hole exposing the source/drain region of the transistor through a selective etching process of the first interlayer insulating film;

e) forming a first oxidation barrier film on the plug and the first interlayer insulating film;

f) forming a lateral oxidation barrier film on sidewalls of the first oxidation barrier film and on a portion of the first interlayer insulating film in order to prevent oxygen from diffusing into an interface therebetween, wherein the lateral oxidation barrier film includes a second oxidation barrier film on sidewalls of the first oxidation barrier film and on a portion of the first interlayer insulating film, and a third oxidation barrier film on the second oxidation barrier film;

g) forming a bottom electrode on the first oxidation barrier film and the lateral oxidation barrier film;

h) forming a ferroelectric thin film on the bottom electrode; and j) forming a top electrode on the ferroelectric thin film.

9. A method for fabrication a ferroelectric random access memory (FeRAM), comprising steps of:

forming a semiconductor substrate;

forming a transistor having a gate insulating film, a gate electrode and a source/drain region that are formed in the semiconductor substrate;

forming a first interlayer insulating film over the transistor;

burying a plug in a contact hole exposing the source/drain region of the transistor through a selective etching process of the first interlayer insulating film;

forming an oxidation barrier film on the plug and on the first interlayer insulating film;

forming an aluminum oxide ($Al_2O_3$) oxidation barrier film on sidewalls of the oxidation barrier film and on a portion of the first interlayer insulating film to be contacted each other in order to prevent oxygen from diffusion into an interface between the aluminum oxide ($Al_2O_3$) oxidation barrier film and the interlayer insulating film;

forming a silicon nitride ($Si_3N_4$) oxidation barrier film on the aluminum oxide ($Al_2O_3$) oxidation barrier film;

forming a bottom electrode on the oxidation barrier film, the aluminum oxide oxidation barrier film and the silicon nitride oxidation barrier film;

forming a ferroelectric film on the bottom electrode;

forming a top electrode on the ferroelectric film; and forming a second interlayer insulating film on the entire structure.

10. The method as recited in claim 9, wherein the oxidation barrier film is one of an iridium (Ir) film and ruthenium (Ru) film.

11. The method as recited in claim 10, wherein the ferroelectric film is selected from the group consisting of $Pb(Zr, Ti)O_3$, $(Bi, La)_4Ti_3O_{12}$ and $SrBi_2Ta_2O_9$.

12. The method as recited in claim 10, wherein the aluminum oxide ($Al_2O_3$) film has a thickness of 100 Å to 300 Å.

* * * * *